United States Patent
Imai

(10) Patent No.: US 7,889,106 B2
(45) Date of Patent: Feb. 15, 2011

(54) CURRENT MIRROR CIRCUIT AND DIGITAL-TO-ANALOG CONVERSION CIRCUIT

(75) Inventor: Shigeo Imai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/854,480

(22) Filed: Aug. 11, 2010

(65) Prior Publication Data

US 2010/0321223 A1 Dec. 23, 2010

Related U.S. Application Data

(62) Division of application No. 12/368,678, filed on Feb. 10, 2009, now Pat. No. 7,800,418.

(30) Foreign Application Priority Data

Feb. 13, 2008 (JP) .............................. 2008-032223

(51) Int. Cl.
*H03M 1/00* (2006.01)
*H03M 1/66* (2006.01)

(52) U.S. Cl. ...................................... 341/136; 341/144

(58) Field of Classification Search ................. 341/150, 341/144, 136, 141, 154
See application file for complete search history.

(56) References Cited

U.S. PATENT DOCUMENTS

| | | | |
|---|---|---|---|
| 4,667,164 A | 5/1987 | Doluca | |
| 4,736,117 A | 4/1988 | Wieser | |
| 5,815,103 A * | 9/1998 | Comminges et al. | 341/144 |
| 6,002,354 A * | 12/1999 | Itoh et al. | 341/144 |
| 6,157,335 A * | 12/2000 | Suzuki et al. | 341/154 |
| 6,191,637 B1 | 2/2001 | Lewicki et al. | |
| 6,452,531 B1 | 9/2002 | Miller et al. | |
| 6,653,961 B1 * | 11/2003 | Gosser et al. | 341/144 |
| 6,657,486 B2 * | 12/2003 | Kimura | 327/563 |
| 6,674,382 B1 * | 1/2004 | Jordan | 341/144 |
| 6,693,574 B2 * | 2/2004 | Yamamura | 341/150 |
| 6,806,749 B2 | 10/2004 | Drusenthal | |
| 7,023,367 B1 * | 4/2006 | Manganaro | 341/136 |
| 2001/0045860 A1 | 11/2001 | Geyson | |
| 2002/0044076 A1 * | 4/2002 | Yao et al. | 341/136 |
| 2005/0122243 A1 * | 6/2005 | Miyagi | 341/141 |
| 2006/0119422 A1 | 6/2006 | Sakurai et al. | |

\* cited by examiner

*Primary Examiner*—Jean B Jeanglaude
(74) *Attorney, Agent, or Firm*—Turocy & Watson, LLP

(57) ABSTRACT

A first switched capacitor circuit is connected to the source of one MOS transistor of a current mirror pair configured by a pair of MOS transistors and a second switched capacitor circuit is connected to the source of the other MOS transistor. Each of the first and second switched capacitor circuits includes a capacitor and a switch connected in parallel with the capacitor and the switch is on/off-controlled based on a clock signal of a preset cycle. Each of the first and second switched capacitor circuits equivalently functions as a resistor with large resistance and a variation in the output current of the current mirror circuit based on a variation in the threshold voltages of the pair of MOS transistors can be reduced even if the power source voltage is reduced.

5 Claims, 7 Drawing Sheets

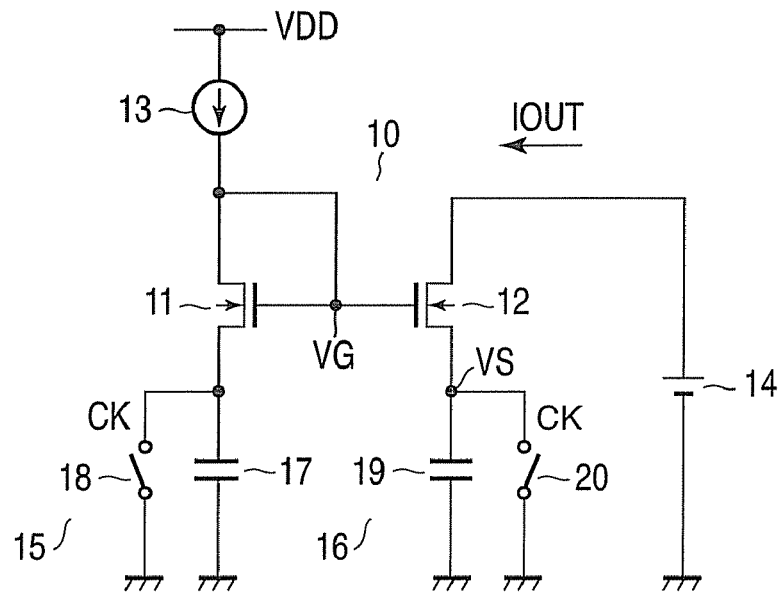
F I G. 1

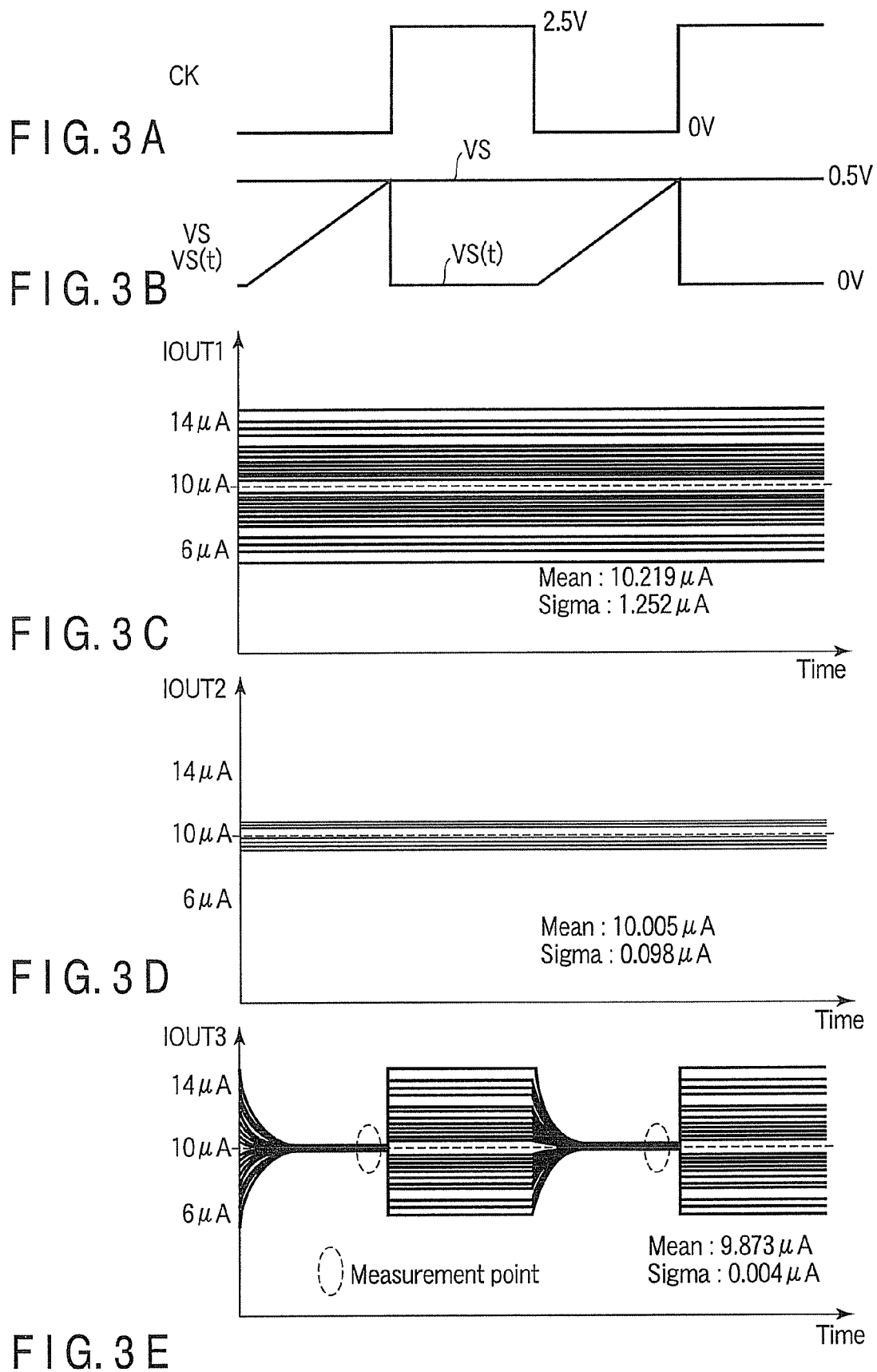

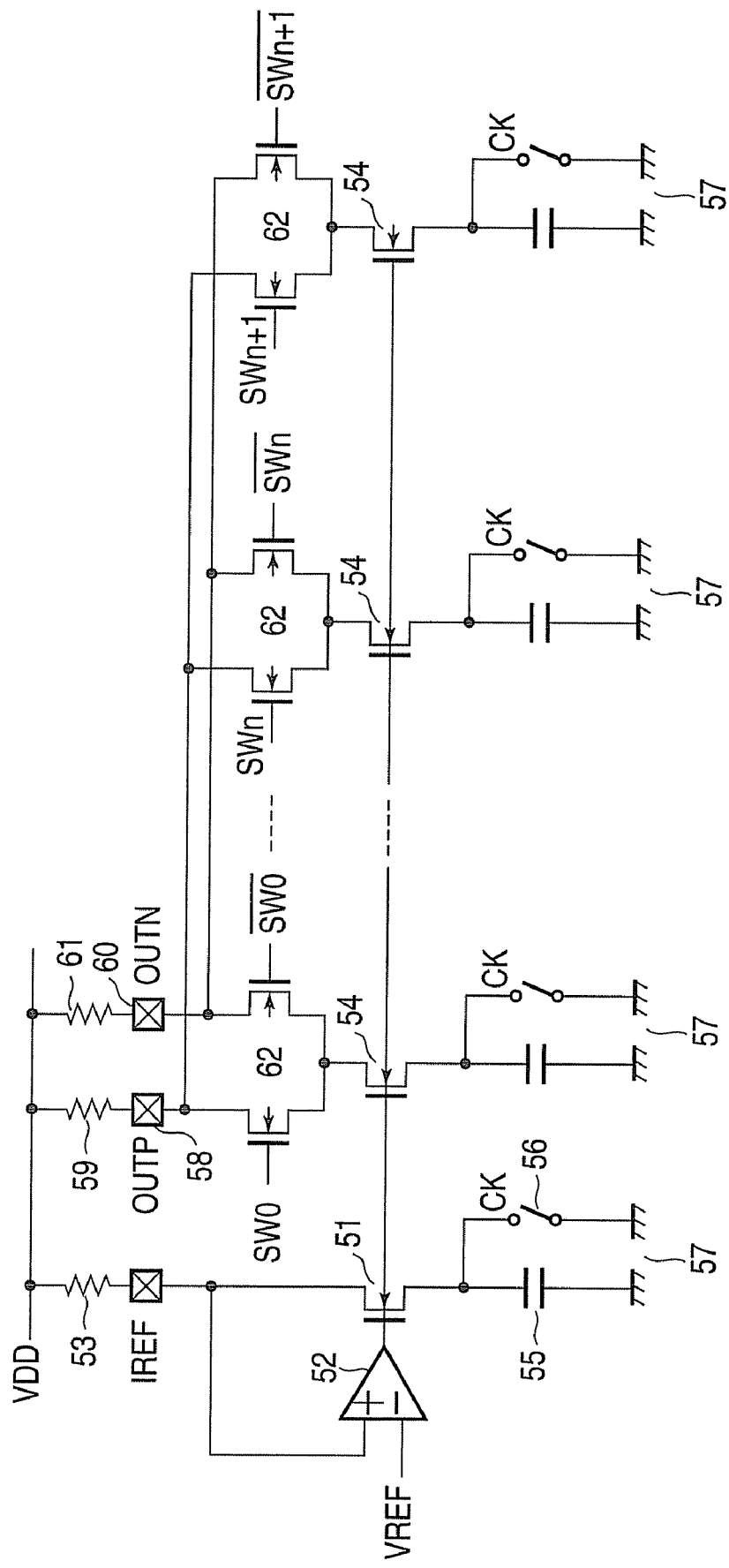
F I G. 9

CURRENT MIRROR CIRCUIT AND DIGITAL-TO-ANALOG CONVERSION CIRCUIT

CROSS-REFERENCE TO RELATED APPLICATIONS

This application is a Division of application Ser. No. 12/368,678 filed Feb. 10, 2009, which is based upon and claims the benefit of priority from prior Japanese Patent Application No. 2008-032223, filed Feb. 13, 2008, the entire contents of both of which are incorporated herein by reference.

BACKGROUND OF THE INVENTION

1. Field of the Invention

This invention relates to a current mirror circuit that copies a current in proportion to an input current and a digital-to-analog conversion circuit using the current mirror circuit.

2. Description of the Related Art

A general current mirror circuit has a configuration in which the gates of a pair of MOS transistors are connected together and the drain and gate of one of the MOS transistors are connected together. In the above current mirror circuit, large current mismatching occurs between the input and output currents due to influences of a variation in elements and particularly a variation in the threshold voltages of the MOS transistors. As a current mirror circuit that reduces the influence of a variation in the elements without enlarging the element area, conventionally, a degenerating resistor current mirror circuit having source resistors connected to the sources of a pair of MOS transistors is known. In the improved current mirror circuit, it is necessary to use the source resistor with large resistance in order to attain a highly effective effect of reducing the degree of current mismatching. As a result, conventionally, a voltage drop in the source resistor of the MOS transistor becomes larger and so it becomes difficult to perform the low-voltage operation.

In U.S. Pat. No. 6,191,637, entitled "SWITCHED CAPACITOR BIAS CIRCUIT FOR GENERATING A REFERENCE SIGNAL PROPORTIONAL TO ABSOLUTE TEMPERATURE, CAPACITANCE AND CLOCK FREQUENCY" by Lewicki et al., the technique of realizing a highly precise current source that is controlled by a clock frequency and reference voltage and in which a switched capacitor is connected to a source side of one of a pair of MOS transistors configuring a current mirror pair is disclosed.

BRIEF SUMMARY OF THE INVENTION

According to a first aspect of the invention, there is provided a current mirror circuit comprising: a current mirror pair that includes first and second MOS transistors having gates, drains and sources and causes a mirror current varying in proportion to a current flowing in the first MOS transistor to flow through the second MOS transistor; a first switched capacitor circuit connected to the source of the first MOS transistor; and a second switched capacitor circuit connected to the source of the second MOS transistor.

According to a second aspect of the invention, there is provided a current mirror circuit comprising: a current mirror pair that includes first and second MOS transistors having gates, drains and sources and causes a mirror current varying in proportion to a current flowing in the first MOS transistor to flow through the second MOS transistor; a first switch having one end and the other end, the one end being connected to the source of the first MOS transistor; a second switch having one end and the other end, the one end being connected to the source of the first MOS transistor; a first switched capacitor circuit connected to the other end of the first switch; a second switched capacitor circuit connected to the other end of the second switch; a third switch having one end and the other end, the one end being connected to the source of the second MOS transistor; a fourth switch having one end and the other end, the one end being connected to the source of the second MOS transistor; a third switched capacitor circuit connected to the other end of the third switch; and a fourth switched capacitor circuit connected to the other end of the fourth switch.

According to a third aspect of the invention, there is provided a digital-to-analog conversion circuit comprising: a first MOS transistor having a gate, drain and source; an operational amplifier that has an inverted input node, non-inverted input node and output node and in which the inverted input node is supplied with a reference voltage and the non-inverted input node and output node are respectively connected to the drain and gate of the first MOS transistor; a first resistor connected between a first power source voltage node and the drain of the first MOS transistor; a plurality of second MOS transistors having gates, drains and sources, the gates being connected to the gate of the first MOS transistor and the second MOS transistors configuring a plurality of current mirror pairs together with the first MOS transistor; a first switched capacitor circuit connected between the source of the first MOS transistor and a second power source voltage node; a plurality of second switched capacitor circuits connected between the sources of the plurality of second MOS transistors and the second power source voltage node; a second resistor having one end and the other end, the one end being connected to the first power source voltage node and the other end being connected to a first analog voltage output node; a third resistor having one end and the other end, the one end being connected to the first power source voltage node and the other end being connected to a second analog voltage output node; and a plurality of switching circuits that are respectively connected between the first and second analog voltage output nodes and the drains of the plurality of second MOS transistors and permit currents flowing through the plurality of second MOS transistors to flow through one of the first and second analog voltage output nodes that are selectively switched based on plural-bit digital signals.

BRIEF DESCRIPTION OF THE SEVERAL VIEWS OF THE DRAWING

FIG. 1 is a circuit diagram showing the configuration of a current mirror circuit according to a first embodiment of this invention;

FIGS. 3A to 3E are waveform diagrams showing first simulation results obtained by performing Monte Carlo analysis for the conventional circuit of FIG. 2 and the circuit of the first embodiment to run simulations;

FIGS. 4A to 4E are waveform diagrams showing second simulation results obtained by performing Monte Carlo analysis for the conventional circuit of FIG. 2 and the circuit of the first embodiment to run simulations;

FIG. 9 is a circuit diagram showing the configuration of a digital-to-analog conversion circuit according to a third embodiment of this invention.

DETAILED DESCRIPTION OF THE INVENTION

Figure 2:
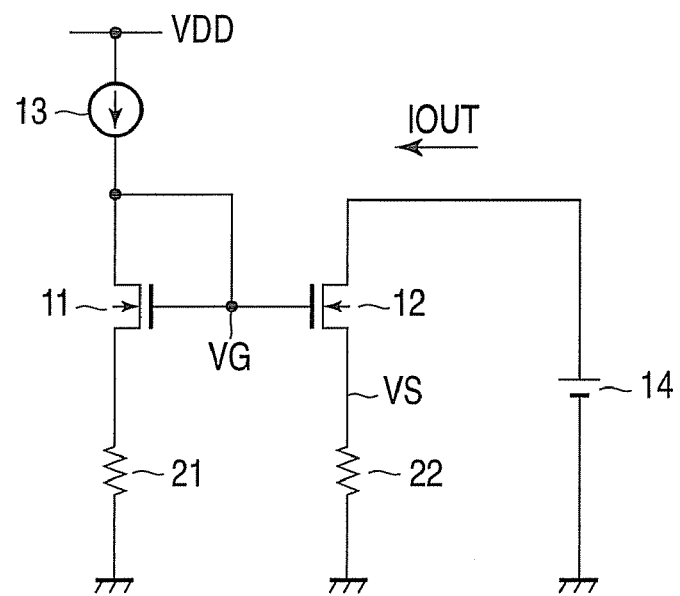
FIG. 2 is a circuit diagram showing the configuration of a conventional current mirror circuit.

There will now be described embodiments of the present invention with reference to the accompanying drawings.

First Embodiment

FIG. 1 is a circuit diagram showing the configuration of a current mirror circuit according to a first embodiment of the present invention. The gates of one pair of N-channel MOS transistors 11, 12 are connected together and the drain and gate of the MOS transistor 11 are connected together to configure a current mirror pair 10 that causes a current (input current) flowing through the MOS transistor 11 to flow as a mirror current (output current) into the MOS transistor 12 according to a preset ratio. The mirror current ratio that is an input/output current ratio in the current mirror pair 10 is determined by the dimensional ratio of the MOS transistors 11, 12, for example, the ratio of the channel widths W of the transistors when the channel lengths L are set to the same value. An input current source 13 is connected between a node of power source voltage VDD and the drain of the input-side MOS transistor 11 of the current mirror pair 10 and a voltage source 14 is connected to the drain of the output-side MOS transistor 12. When the current mirror circuit is used in combination with another circuit, a load circuit to which an output current of the current mirror circuit is supplied is connected instead of the voltage source 14.

Switched capacitor circuits 15, 16 are respectively connected between the sources of the MOS transistors 11, 12 and the ground voltage node. The switched capacitor circuit 15 includes a capacitor 17 and a switch 18 connected in parallel with the capacitor 17. The switch 18 is on/off-controlled in synchronism with a clock signal CK of a preset cycle. Likewise, the switched capacitor circuit 16 includes a capacitor 19 and a switch 20 connected in parallel with the capacitor 19. The switch 20 is also on/off-controlled in synchronism with the clock signal CK. That is, both of the switches 18 and 20 are on/off-controlled on the same cycle with the same phase.

For example, the switches 18, 20 may be configured by independent N-channel or P-channel MOS transistors, or analog switches configured by connecting N-channel and P-channel MOS transistors in parallel. In this example, the switch is configured by, for example, an N-channel MOS transistor that is gate-controlled by a clock signal CK. The capacitance ratio of the capacitors 17 and 19 is set to the same value as the mirror current ratio of the current mirror pair 10.

In the current mirror circuit of FIG. 1, the capacitors 17, 19 are charged for a preset period by currents respectively flowing through the paired MOS transistors 11, 12 configuring the current mirror pair when the clock signal CK is low and the switches 18, 20 in the switched capacitor circuits 15, 16 are both off. On the other hand, when the clock signal CK is high and the switches 18, 20 are both on, neither of the capacitors 17, 19 is charged. That is, each of the switched capacitor circuits 15, 16 equivalently acts as a resistor having large resistance and has the same function as the source resistor of the conventional circuit.

Now, the characteristics of the conventional circuit and the circuit of the above embodiment are considered. FIG. 2 shows the configuration of a conventional degenerating resistor current mirror circuit having source resistors. As described before, the circuit of FIG. 2 has a configuration in which source resistors 21, 22 are respectively connected to a pair of MOS transistors 11, 12 configuring a current mirror pair.

In the circuit of FIG. 2, it is supposed that the transfer conductance of the current mirror pair is Gm, the gate potential of the MOS transistor 12 is VG, the source potential is VS, the resistance of each of the source resistors 21, 22 is R and an output current is IOUT on the assumption that there is no difference between the threshold voltages of the MOS transistors 11 and 12. Then, IOUT is given by the following equation 1.

$$IOUT = Gm(VG - VS) \quad (1)$$
$$= Gm(VG - R*IOUT)$$
$$= \frac{Gm}{RGm+1}VG$$

In this case, if the threshold voltages of the MOS transistors 11, 12 vary and the threshold voltage Vth12 of the MOS transistor 12 is higher by ΔVth than the threshold voltage Vth11 of the MOS transistor 11 (Vth12=Vth11+ΔVth), IOUT' is given by the following equation 2.

$$IOUT' = \frac{Gm}{RGm+1}(VG - \Delta Vth) \quad (2)$$
$$= \frac{Gm}{RGm+1}VG - \frac{Gm}{RGm+1}\Delta Vth$$

In equation 2, the first term of the right side indicates IOUT obtained when no difference occurs in the threshold voltage and the second term indicates a variation in the output current caused when a variation in the threshold voltage occurs.

On the other hand, in the circuit of this embodiment shown in FIG. 1, it is supposed that the transfer conductance of the current mirror pair is Gm, the capacitance of the capacitors 17, 19 is C, the gate potential and the source potential of the MOS transistor 12 on the output side are respectively set to VG and VS(t) and an output current is IOUT(t) on the assumption that there is no difference between the threshold voltages of the MOS transistors 11 and 12. Then, VS(t) is given by equation 3, below. In the circuit of this embodiment shown in FIG. 1, since the switches 18, 20 are on/off-controlled, the output current and the source potential of the MOS transistors 12 are expressed by a function of time. Further, IOUT(t) is given by the equation 4, below, which is derived from equation 3.

$$VS(t) = \frac{1}{C}\int_{t1}^{t2} IOUT(t)dt \quad (3)$$
$$IOUT(t) = Gm(VG - VS(t)) \quad (4)$$
$$= \frac{Gm}{xepGm\Delta t/C}$$

In this case, if the threshold voltages of the MOS transistors 11, 12 vary and the threshold voltage Vth12 of the MOS transistor 12 is higher by ΔVth than the threshold voltage Vth11 of the MOS transistor 11 (Vth12=Vth11+ΔVth), IOUT'(t) is given by the following equation 5.

$$IOUT'(t) = \frac{Gm}{xepGm\Delta t/C}(VG - \Delta Vth)$$

$$= \frac{Gm}{xepGm\Delta t/C}VG - \frac{Gm}{xepGm\Delta t/C}\Delta Vth \quad (5)$$

In equation 5, the first term of the right side indicates an output current when no difference occurs in the threshold voltage and the second term indicates a variation in the output current when a variation in the threshold voltage occurs.

In this case, if Δt/C is selected to set up the equation of Δt/C=R (R indicates the resistance of each of the source resistors in the circuit of FIG. 2), a value corresponding to RGm in equation 2 becomes a multiplier of a natural logarithm of RGm in equation 5. That is, in the circuit of the present embodiment of FIG. 1, Gm appears to be markedly reduced in comparison with that of the circuit of FIG. 2. As a result, even if Δt/C is set small (the operating point corresponding to the voltage value of VS is reduced), the effect of markedly reducing the variation in the output current IOUT(t) can be attained. That is, even if the power source voltage VDD is reduced, a variation in the output current based on a variation in the threshold voltage can be markedly reduced.

That is, in the circuit of this embodiment, the switched capacitor circuits 15, 16 configured by the capacitors 17, 19 and the switches 18, 20 are connected instead of the source resistors in the conventional circuit. Then, it becomes possible to attain the negative feedback effect capable of markedly reducing the transfer conductance of the current mirror circuit by use of equivalent large resistances determined by charging the capacitors 17, 19 for a preset period by currents of the current mirror circuit itself. As a result, a highly precise current mirror circuit in which current mismatching between the input and output currents can be markedly reduced can be attained even if the supply voltage is low.

The result of simulations of the output currents attained by performing Monte Carlo analysis in the circuit of FIG. 2 and the circuit of this embodiment is explained. In the first simulation, the operating points of the circuit of FIG. 2 and the circuit of this embodiment are equally set. In this case, it is supposed that a variation in the elements occurs only in the MOS transistors and the other elements, that is, resistors, capacitors and switches are all ideal elements. At this time, the power source voltage VDD is set at 2.5V, the current value of the input current source 13 is set to 10 μA, the voltage of the voltage source 14 is set to the same voltage as VG, the resistance R of each of the source resistors 21, 22 in the circuit of FIG. 2 is set to 50 kΩ, the capacitance C of each of the capacitors 17, 19 of this embodiment is set to 250 fF and the frequency of the clock signal CK is set to 40 MHz.

In the circuit of FIG. 2, the source voltage VS of the transistor 12 is set to 50 kΩ×10 μA=0.5V by setting the input current to 10 μA and setting the resistance R to 50 kΩ. On the other hand, in the circuit of this embodiment, the maximum value VS(max) of the source voltage VS(t) of the transistor 12 is set to 10 μA/(250 fF×2×40 MHz)=0.5V by setting the capacitance C to 250 fF and setting the clock frequency to 40 MHz. Thus, the operating points of the circuits of FIGS. 1 and 2 are set equal to each other at 0.5V.

FIGS. 3A to 3E show first simulation results. The abscissa indicates time and the ordinate indicates voltage or current. FIG. 3A shows the clock signal CK used to control the switches 18, 20. Since the switches 18, 20 are configured by N-channel MOS transistors, the switches 18, 20 are both off when the clock signal is low (0V) and both on when the clock signal is high (2.5V). FIG. 3B shows the simulation results of the source voltage VS of the MOS transistor 12 in the circuit of FIG. 2 that is the conventional circuit and the source voltage VS(t) of the MOS transistor 12 in the circuit of this embodiment shown in FIG. 1. The operating points of the above two circuits are set equal to each other immediately before the clock signal CK goes high. FIG. 3C shows the result of Monte Carlo analysis of an output current IOUT1 in a general current mirror circuit configured only by a pair of MOS transistors for reference. FIG. 3D shows the result of Monte Carlo analysis of an output current IOUT2 in the circuit of FIG. 2. Further, FIG. 3E shows the result of Monte Carlo analysis of an output current IOUT3 in the circuit of this embodiment shown in FIG. 1.

The results of derivation of mean values and standard deviations (Sigma) as the statistical characteristics of the output currents shown in FIGS. 3C to 3E are shown in the following Table 1. However the statistical characteristics of FIG. 3E is measured at the measurement point shown by the dotted circle in FIG. 3E.

TABLE 1

| IOUT | Mean (μA) | Sigma (μA) |
|---|---|---|
| IOUT1 | 10.219 | 1.252 |
| IOUT2 | 10.005 | 0.098 |
| IOUT3 | 9.873 | 0.004 |

It is clearly understood from the Table 1 that a current variation (Sigma) in the output current IOUT3 of the circuit of this embodiment in FIG. 1 is reduced to approximately 1/20 that in the output current IOUT2 of the circuit of FIG. 2 although the operating points of the circuits of FIGS. 1 and 2 are set equal to each other at 0.5V.

Next, a second simulation result is explained. In the first simulation, a current variation occurring in the output current when the operating points of the circuits of FIGS. 1 and 2 are set equal to each other is analyzed. On the other hand, in the second simulation, the operating point in a condition in which current variations in the output currents are set equal to each other is analyzed. Also, in this case, it is supposed that a variation in the elements occurs only in the MOS transistors and the other elements are all ideal elements. Further, at this time, the power source voltage VDD is set at 2.5V, the current value of the input current source 13 is set to 10 μA, the voltage of the voltage source 14 is set to the same voltage as VG, the resistance R of each of the source resistors 21, 22 in the circuit of FIG. 2 is set to 50 kΩ, the capacitance C of each of the capacitors 17, 19 of this embodiment is set to 1 fF and the frequency of the clock signal CK is set to 40 MHz.

In the circuit of FIG. 2, the source voltage VS of the transistor 12 is set to 0.5V by setting the input current to 10 μA and setting the resistance R to 50 kΩ. On the other hand, in this embodiment, the maximum value VS(max) of the source voltage VS(t) of the transistor 12 is set to 10 μA/(1 fF×2×40 MHz)=0.125V by setting the capacitance C to 1 fF and setting the clock frequency to 40 MHz.

Figures 4C, 4D, 4E:
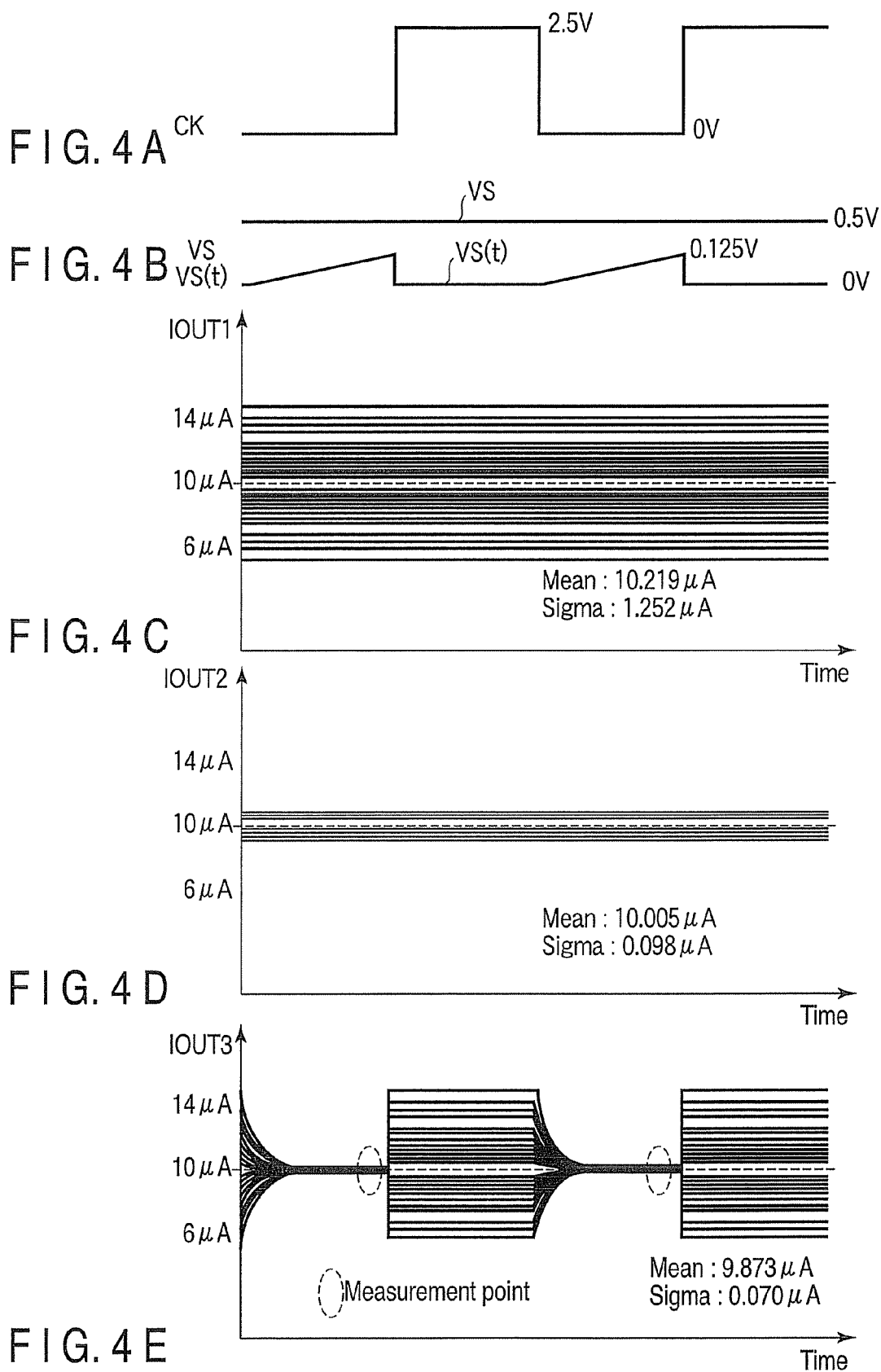

FIGS. 4A to 4E show second simulation results. Like the case of FIG. 3, the abscissa indicates time and the ordinate indicates voltage or current. FIG. 4A shows the clock signal CK used to control the switches 18, 20. FIG. 4B shows the simulation results of the source voltage VS of the MOS transistor 12 in the circuit of FIG. 2 and the source voltage VS(t) of the MOS transistor 12 in the circuit of this embodiment shown in FIG. 1. As shown in FIG. 4B, the operating point of the circuit of FIG. 2 is set to 0.5V. However, in the circuit of this embodiment of FIG. 1, the operating point is set to the maximum value and becomes 0.125V immediately before the clock signal CK goes high. FIG. 4C shows the result of Monte Carlo analysis of an output current IOUT1 in a general current mirror circuit configured only by a pair of MOS transistors for reference. FIG. 4D shows the result of Monte Carlo analysis of an output current IOUT2 in the circuit of FIG. 2. Further, FIG. 4E shows the result of Monte Carlo analysis of an output current IOUT3 in the circuit of this embodiment shown in FIG. 1.

The results of derivation of mean values and standard deviations (Sigma) as the statistical characteristics of the output currents shown in FIGS. 4C to 4E are shown in the following Table 2. However the statistical characteristics of FIG. 4E is measured at the measurement point shown by the dotted circle in FIG. 4E.

TABLE 2

| IOUT | Mean (µA) | Sigma (µA) |
|---|---|---|
| IOUT1 | 10.219 | 1.252 |
| IOUT2 | 10.005 | 0.098 |
| IOUT3 | 9.873 | 0.070 |

As shown in the Table 2, the current variation (Sigma) of the output current IOUT3 of the circuit of this embodiment shown in FIG. 1 is approximately equal to that of the output current IOUT2 of the circuit of FIG. 2. However, as shown in FIG. 4B, the operating point (VS(t)) of the circuit of this embodiment shown in FIG. 1 can be reduced to 0.125V in comparison with the operating point (VS) 0.5V of the circuit of FIG. 2. That is, the circuit of this embodiment shown in FIG. 1 is operated on voltage that is approximately equal to ¼ that of the circuit of FIG. 2 and, as a result, the reduced-voltage operation can be performed in the circuit of this embodiment in comparison with the circuit of FIG. 2.

The current mirror circuit of this embodiment includes the current mirror pair 10 that includes the first and second MOS transistors 11, 12 having gates, drains and sources and causes a mirror current varying in proportion to a current flowing in the first MOS transistor 11 to flow through the second MOS transistor 12, the first switched capacitor circuit 15 connected to the source of the first MOS transistor 11, and the second switched capacitor circuit 16 connected to the source of the second MOS transistor 12.

With the above configuration, the degree of mismatching of the input and output currents can be suppressed to approximately ½₀ that of the conventional circuit when the above circuit is operated at the same operating point as that of the circuit of FIG. 2. Further, when the above circuit is operated to set the degree of current mismatching equal to that of the circuit of FIG. 2, the operating point can be set lower than that of the circuit of FIG. 2. As a result, a highly effective effect of reducing the degree of mismatching of the input and output currents can be attained in comparison with that of the circuit of FIG. 2 and the low-voltage operation can be realized.

Second Embodiment

Figure 5:
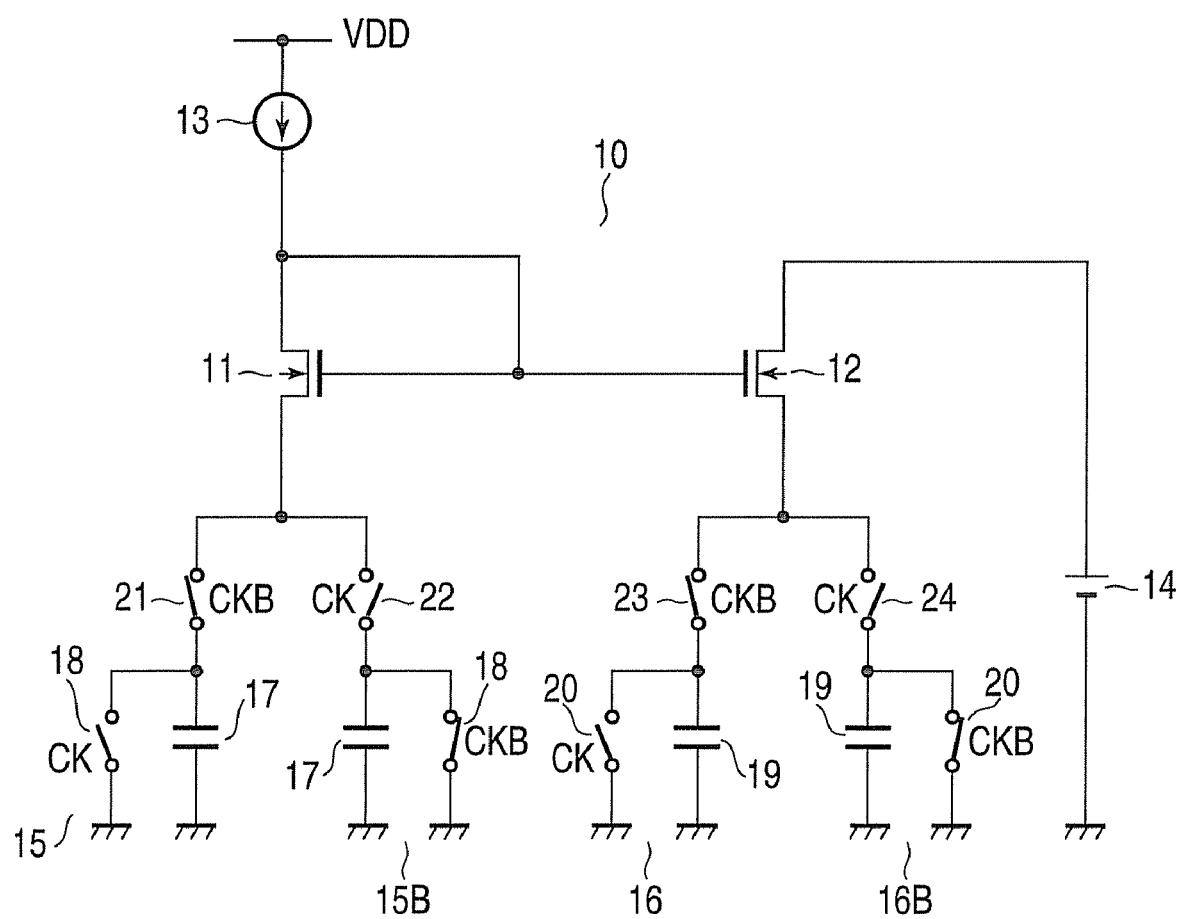
FIG. 5 is a circuit diagram showing the configuration of a current mirror circuit according to a second embodiment of this invention.

Next, a second embodiment of the present invention in which a period in which a variation occurring in the output current is reduced can be attained in both phases of a clock signal CK is explained with reference to FIG. 5. In a current mirror circuit of this embodiment, two sets of switched capacitor circuits having the same configuration as that of the switched capacitor circuit added in the circuit of the embodiment shown in FIG. 1 are respectively prepared for two MOS transistors 11, 12 configuring a current mirror pair 10. The two sets of switched capacitor circuits are selectively switched by use of switches to attain the effect of reducing a current variation in both periods in which the clock signal CK is high and low. In FIG. 5, portions that are the same as those of FIG. 1 are denoted by the same symbols and the explanation thereof is omitted.

Two sets of switched capacitor circuits 15, 15B with the same configuration as that of the switched capacitor circuit 15 of FIG. 1 are connected to the MOS transistor 11 that is one of the pair of N-channel MOS transistors 11 and 12 configuring the current mirror pair 10. Likewise, two sets of switched capacitor circuits 16, 16B with the same configuration as that of the switched capacitor circuit 16 of FIG. 1 are connected to the other MOS transistor 12. Like the case of FIG. 1, capacitances 17, 19 of the switched capacitor circuits 15, 15B and 16, 16B are set to the same value.

The switched capacitor circuits 15, 15B are connected to the source of the MOS transistor 11 via switches 21, 22, respectively. The switch 21 is on/off-controlled in synchronism with a clock signal CKB (CKB is an inverted signal of CK) of a preset cycle and the other switch 22 is on/off-controlled in synchronism with clock signal CK of the preset cycle.

The switched capacitor circuits 16, 16B are connected to the source of the MOS transistor 12 via switches 23, 24, respectively. The switch 23 is on/off-controlled in synchronism with the clock signal CKB of the preset cycle and the other switch 24 is on/off-controlled in synchronism with the clock signal CK of the preset cycle.

The switches 18, 20 of the switched capacitor circuits 15B, 16B are on/off-controlled in synchronism with the clock signals CK and CKB.

In the circuit of this embodiment, the switches 21, 23 are both on while the clock signal CKB is high (the clock signal CK is low) to respectively connect the switched capacitor circuits 15, 16 to the sources of the pair of MOS transistors 11, 12 and thus the switched capacitor circuits 15, 16 equivalently function as resistors having large resistances. Further, the switches 22, 24 are both on while the clock signal CK is high (the clock signal CKB is low) to respectively connect the switched capacitor circuits 15B, 16B to the sources of the pair of MOS transistors 11, 12 and thus the switched capacitor circuits 15B, 16B equivalently function as resistors having large resistances.

Now, the results obtained by performing Monte Carlo analysis for the circuit of FIG. 2 and the circuit of the this embodiment and simulating output currents are explained. In this simulation, the operating points of the circuit of FIG. 2 and the circuit of this embodiment are set to the equal value. In this case, it is supposed that a variation in the elements occurs only in the MOS transistors and the other elements, that is, resistors, capacitors and switches are all ideal elements. At this time, the power source voltage VDD is set at 2.5V, the current value of the input current source 13 is set to 10 µA, the voltage of the voltage source 14 is set to the same voltage as VG, the resistance R of each of the source resistors 21, 22 in the conventional circuit is set to 50 kΩ, the capacitance C of each of the capacitors 17, 19 of this embodiment is set to 250 fF and the frequencies of the clock signals CK, CKB are each set to 40 MHz.

In the circuit of FIG. 2, the source voltage VS of the transistor 12 is set to 50 kΩ×10 μA=0.5V by setting the input current to 10 μA and setting the resistance R to 50 kΩ. On the other hand, in the circuit of this embodiment, the maximum value VS(max) of the source voltage VS(t) of the transistor 12 is set to 10 μA/(250 fF×2×40 MHz)=0.5V by setting the capacitance C to 250 fF and setting the clock frequency to 40 MHz. Thus, the operating points of the circuits of FIGS. 5 and 2 are set equal to each other at 0.5V.

Figure 6A:
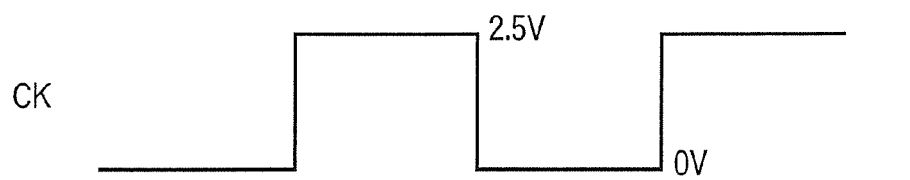
FIGS. 6A to 6E are waveform diagrams showing second simulation results obtained by performing Monte Carlo analysis for the conventional circuit of FIG. 2 and the circuit of the second embodiment to run simulations.
Figure 6B:
Figure 6C:
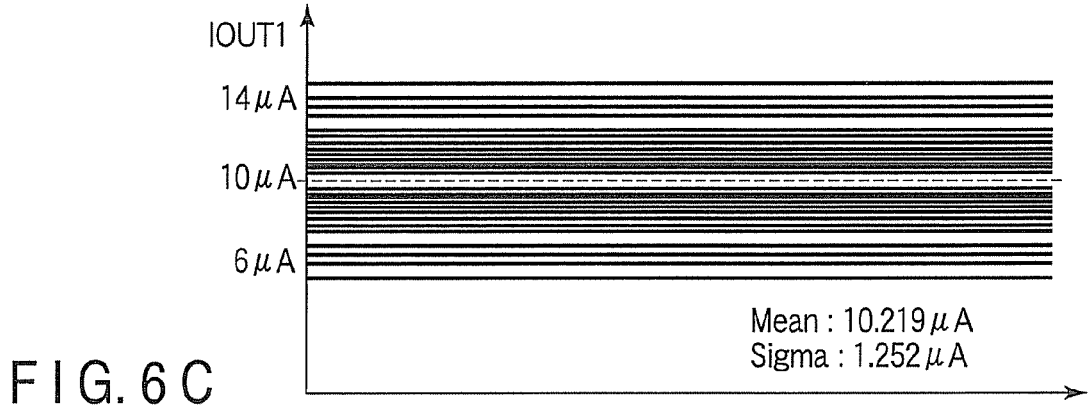
Figure 6D:
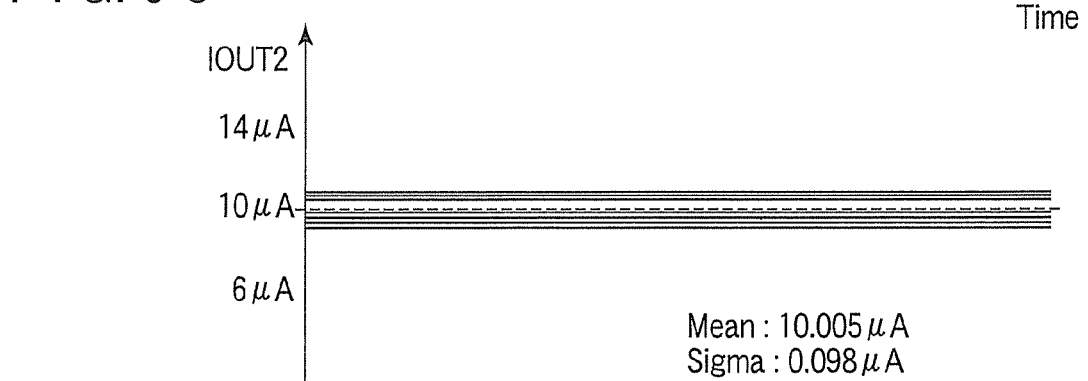
Figure 6E:
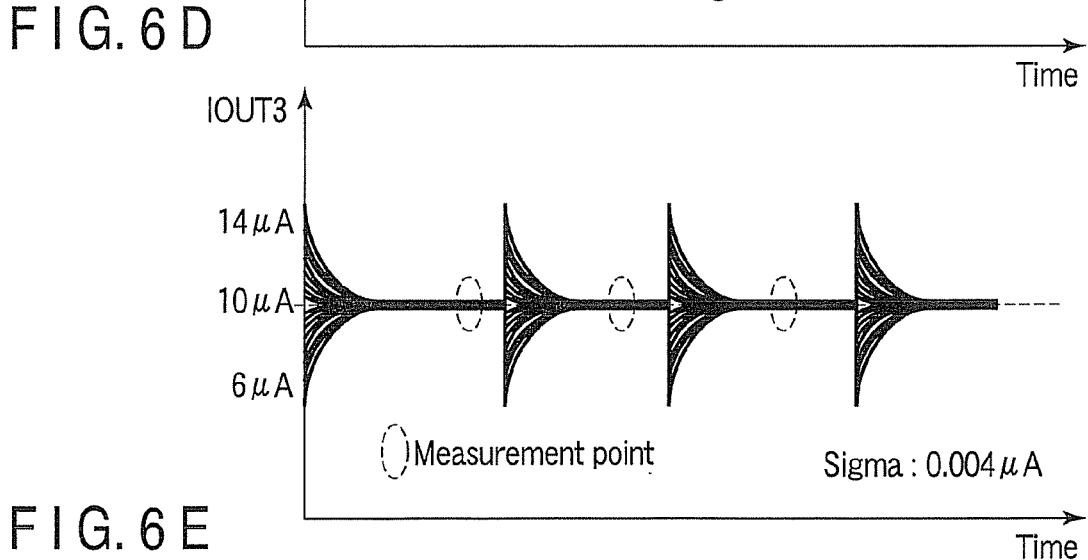

FIGS. 6A to 6E show the simulation results. The abscissa indicates time and the ordinate indicates voltage or current. FIG. 6A shows a clock signal CK used to control the switches 18, 20 and 21 to 24. When the clock signal CK is low (0V), the switches 21, 23 are on and the switches 18, 20 of the switched capacitor circuits 15, 16 are off. Further, when the clock signal is high (2.5V), the switches 22, 24 are on and the switches 18, 20 of the switched capacitor circuits 15B, 16B are off. FIG. 6B shows the simulation results of the source voltage VS of the MOS transistor 12 in the circuit of FIG. 2 and the source voltage VS(t) of the MOS transistor 12 in the circuit of this embodiment shown in FIG. 5. The operating points of the above two circuits are set approximately equal to each other immediately before the clock signal CK goes high and immediately before the clock signal CK goes low. FIG. 6C shows the result of Monte Carlo analysis of an output current IOUT1 in a general current mirror circuit configured only by a pair of MOS transistors for reference. FIG. 6D shows the result of Monte Carlo analysis of an output current IOUT2 in the circuit of FIG. 2. Further, FIG. 6E shows the result of Monte Carlo analysis of an output current IOUT3 in the circuit of this embodiment shown in FIG. 5.

In the circuit of this embodiment, the same effect as that of the first embodiment can be attained and the degree of mismatching of the input and output currents can be reduced not only while the clock signal is low but also while it is high.

Modifications of First and Second Embodiments

Figure 7:
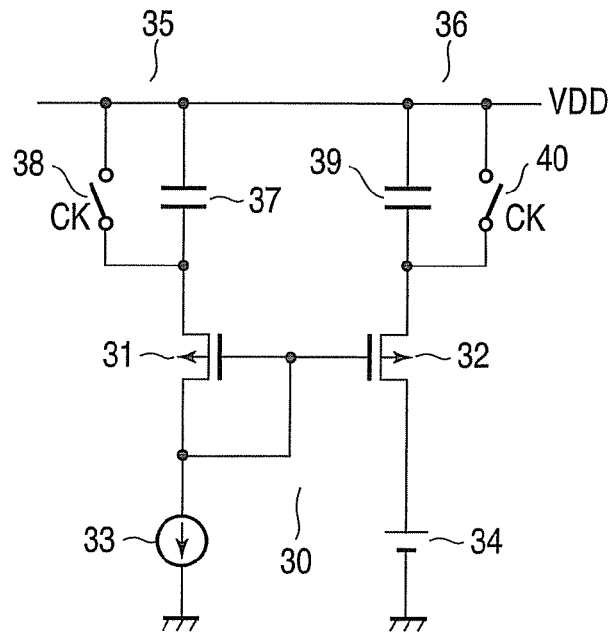
FIG. 7 is a circuit diagram showing the configuration of a current mirror circuit according to a modification of the first embodiment.

In the first and second embodiments, a case wherein the current mirror pair is configured by the N-channel MOS transistors is explained. However, the current mirror pair may be configured by P-channel MOS transistors. FIG. 7 shows a current mirror circuit according to a modification of the first embodiment by configuring a current mirror pair 30 with P-channel MOS transistors 31, 32. When the current mirror pair is configured by using the P-channel MOS transistors, an input current source 33 is connected between the drain of the MOS transistor 31 and the ground voltage node. A voltage source 34 is connected between the drain of the MOS transistor 32 and the ground voltage node. Further, switched capacitor circuits 35, 36 are respectively connected between the sources of the MOS transistors 31, 32 and the node of the power source voltage VDD. The switched capacitor circuits 35, 36 are configured by capacitors 37, 39 and switches 38, 40 respectively connected in parallel with the capacitors 37, 39. In this case, the switches 38, 40 may be configured by using P-channel MOS transistors as in the current mirror pair 30, N-channel MOS transistors as described before or analog switches configured by connecting N-channel and P-channel MOS transistors in parallel. The capacitance ratio of the capacitors 37 and 39 is set to the same value as the mirror current ratio of the current mirror pair 30.

Figure 8:
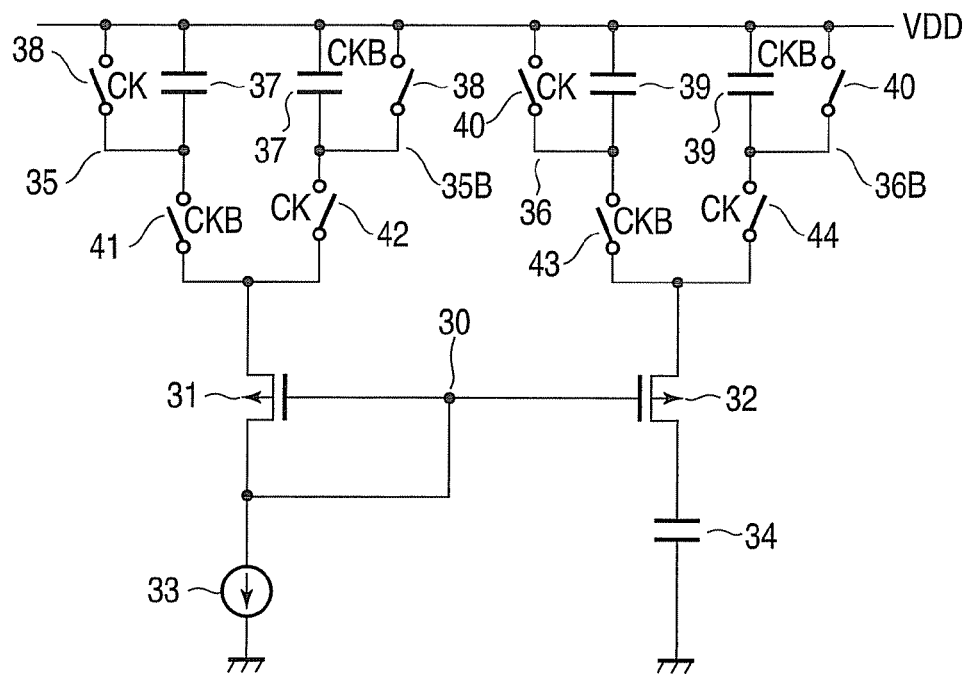
FIG. 8 is a circuit diagram showing the configuration of a current mirror circuit according to a modification of the second embodiment.

Like the modification of the first embodiment, the current mirror pair of the second embodiment can be configured by using P-channel MOS transistors. FIG. 8 shows a modification of the second embodiment in which the current mirror pair 30 is configured by using P-channel MOS transistors 31, 32. Portions denoted by symbols of thirty something in FIG. 8 correspond to portions denoted by symbols of ten something in FIG. 5 and portions denoted by symbols of forty something in FIG. 8 correspond to portions denoted by symbols of twenty something in FIG. 5, and therefore, the detailed explanation thereof is omitted.

Third Embodiment

FIG. 9 is a circuit diagram showing the configuration of a third embodiment to which this invention is applied to a digital-to-analog conversion circuit using to a current mirror circuit. The digital-to-analog conversion circuit of this embodiment includes an N-channel MOS transistor 51, operational amplifier 52, first resistor 53, second resistor 59, third resistor 61, a plurality of N-channel MOS transistors 54, a plurality of switched capacitor circuits 57 and a plurality of switching circuits 62.

The operational amplifier 52 has an inverted input node, non-inverted input node and output node, reference voltage VREF is supplied to the inverting input node, and the non-inverting input node and output node are respectively connected to the drain and gate of the MOS transistor 51. The first resistor 53 is connected between the node of power source voltage VDD and the drain of the MOS transistor 51. The gates of the N-channel MOS transistors 54 are commonly connected to the gate of the MOS transistor 51 and respectively configure current mirror pairs together with the MOS transistor 51. Each of the switched capacitor circuits 57 is configured by a capacitor 55 and a switch 56 that is connected in parallel with the capacitor 55 and on/off-controlled by a clock signal CK. The switched capacitor circuits 57 are connected between the source of the MOS transistor 51 and the ground voltage node and between the sources of the N-channel MOS transistors 54 and the ground voltage node. The second resistor 59 is connected at one end to the node of the power source voltage VDD and connected at the other end to a first analog voltage output node 58. The third resistor 61 is connected at one end to the node of the power source voltage VDD and connected at the other end to a second analog voltage output node 60. The switching circuits 62 are connected between the first and second analog voltage output nodes 58, 60 and the drains of the respective MOS transistors 54. The switching circuits 62 cause currents flowing through the MOS transistors 54 to selectively flow into the first and second analog voltage output nodes 58, 60 according to plural-bit complementary digital signals SW0, /SW0 . . . SWn, /SWn, SWn+1, /SWn+1. As shown in FIG. 9, for example, each of the switching circuits 62 is configured by an N-channel MOS transistor whose gate is supplied with a signal SWi (i=0 to n+1) that is one of the complementary digital signals and an N-channel MOS transistor whose gate is supplied with the other signal /SWi.

The basic operation of the digital-to-analog conversion circuit of FIG. 9 is as follows. That is, it is controlled to cause a constant current IREF corresponding to the resistance of the first resistor 53 and reference voltage VREF to flow through the first resistor 53 by the feedback operation of the operational amplifier 52, and the current IREF is input to the MOS transistor 51 as an input current. Currents corresponding to the mirror current ratios of the respective current mirror pairs are made to flow through the MOS transistors 54 that configure the current mirror pairs together with the MOS transistor 51. For example, the mirror current ratios of the current mirror pairs are all set to the same value. The currents flowing through the respective MOS transistors 54 are selectively switched by the switching circuits 62 according to the plural-bit complementary digital signals SW0, /SW0 . . . SWn, /SWn, SWn+1, /SWn+1 and are permitted to selectively flow through one of the first and second analog voltage output nodes 58, 60. Then, analog voltages OUTP, OUTN corresponding to the total sum of the currents flowing through the second, third resistors 59, 61 and the resistances of the second, third resistors 59, 61 are output from the first and second analog voltage output nodes 58, 60.

The switched capacitor circuits 57 are respectively connected to the sources of the MOS transistor 51 and the MOS transistors 54 that configure the current mirror pairs together with the MOS transistor 51. Like the switched capacitor circuits in the first and second embodiments and the modifications thereof, each of the switched capacitor circuits 57 equivalently functions as a source resistor. As a result, in the digital-to-analog conversion circuit of this embodiment, the low-voltage operation can be realized, a current variation can be suppressed and a digital-to-analog conversion operation can be performed with high precision.

This invention is not limited to the above embodiments and can be variously modified without departing from the technical scope thereof at the embodying stage. Further, inventions of various stages are contained in the above embodiments and various inventions can be extracted by adequately combining a plurality of constituents disclosed. For example, if the problem described in the item of "problem to be solved by this invention" can be solved and the effect described in the item of "effect of this invention" can be obtained even when some constituents are omitted from all of the constituents indicated in the embodiments, the configuration from which the above constituents are omitted can be extracted as the invention.

What is claimed is:

1. A digital-to-analog conversion circuit comprising:
   a first MOS transistor having a gate, drain and source;
   an operational amplifier that has an inverted input node, non-inverted input node and output node and in which the inverted input node is supplied with a reference voltage and the non-inverted input node and output node are respectively connected to the drain and gate of the first MOS transistor;
   a first resistor connected between a first power source voltage node and the drain of the first MOS transistor;
   a plurality of second MOS transistors having gates, drains and sources, the gates being connected to the gate of the first MOS transistor and the second MOS transistors configuring a plurality of current mirror pairs together with the first MOS transistor;
   a first switched capacitor circuit connected between the source of the first MOS transistor and a second power source voltage node;
   a plurality of second switched capacitor circuits connected between the sources of the plurality of second MOS transistors and the second power source voltage node;
   a second resistor having one end and the other end, the one end being connected to the first power source voltage node and the other end being connected to a first analog voltage output node;
   a third resistor having one end and the other end, the one end being connected to the first power source voltage node and the other end being connected to a second analog voltage output node; and
   a plurality of switching circuits that are respectively connected between the first and second analog voltage output nodes and the drains of the plurality of second MOS transistors and permit currents flowing through the plurality of second MOS transistors to flow through one of the first and second analog voltage output nodes that are selectively switched based on plural-bit digital signals.

2. The digital-to-analog conversion circuit according to claim 1, wherein the first MOS transistor and the plurality of second MOS transistors are N-channel MOS transistors.

3. The digital-to-analog conversion circuit according to claim 1, wherein the first switched capacitor circuit includes a first capacitor and a first switch connected in parallel with the first capacitor, and each of the plurality of second switched capacitor circuits includes a second capacitor and a second switch connected in parallel with the second capacitor.

4. The digital-to-analog conversion circuit according to claim 3, wherein the first switch is a switch that is on/off-controlled on a preset cycle, and the second switch is a switch that is on/off-controlled on the same cycle as the first switch and in the same phase as the first switch.

5. The digital-to-analog conversion circuit according to claim 3, wherein capacitances of the first and second capacitors are set to the same value.

* * * * *